United States Patent [19]
Bortot et al.

[11] Patent Number: 5,717,349
[45] Date of Patent: Feb. 10, 1998

[54] WIDEBAND DIGITAL PEAK DETECTOR

[75] Inventors: Pier L. Bortot, Nepean; P. Michael Gale, Kanata, both of Canada

[73] Assignee: Omega Telemus Inc., Kanata, Canada

[21] Appl. No.: 545,090

[22] Filed: Oct. 19, 1995

[30] Foreign Application Priority Data

Oct. 24, 1994 [CA] Canada ................. 2134310

[51] Int. Cl.[6] ................................................. G01R 19/00
[52] U.S. Cl. ................................................ 327/58; 327/62
[58] Field of Search ............................. 327/58–62, 354, 327/104, 184

[56] References Cited

U.S. PATENT DOCUMENTS 5,416,432  5/1995  Lewis et al. ................. 327/58
5,477,142  12/1995  Good et al. ................... 327/4
5,640,109  6/1997  Nyce ........................... 327/58

*Primary Examiner*—Toan Tran
*Attorney, Agent, or Firm*—E. E. Pascal

[57] ABSTRACT

A digital peak detector formed of a plurality of comparators for outputting signals which, in combination, can form a thermometer code signal, apparatus for distributing an analog input signal to an input of each of the comparators, a plurality of digital to analog converters (DACs), apparatus for providing an output signal of each DAC to another input of a corresponding comparator, and apparatus for applying a digital signal to an input of each DAC to establish a comparison level against which a corresponding DAC can determine an output signal level.

14 Claims, 7 Drawing Sheets

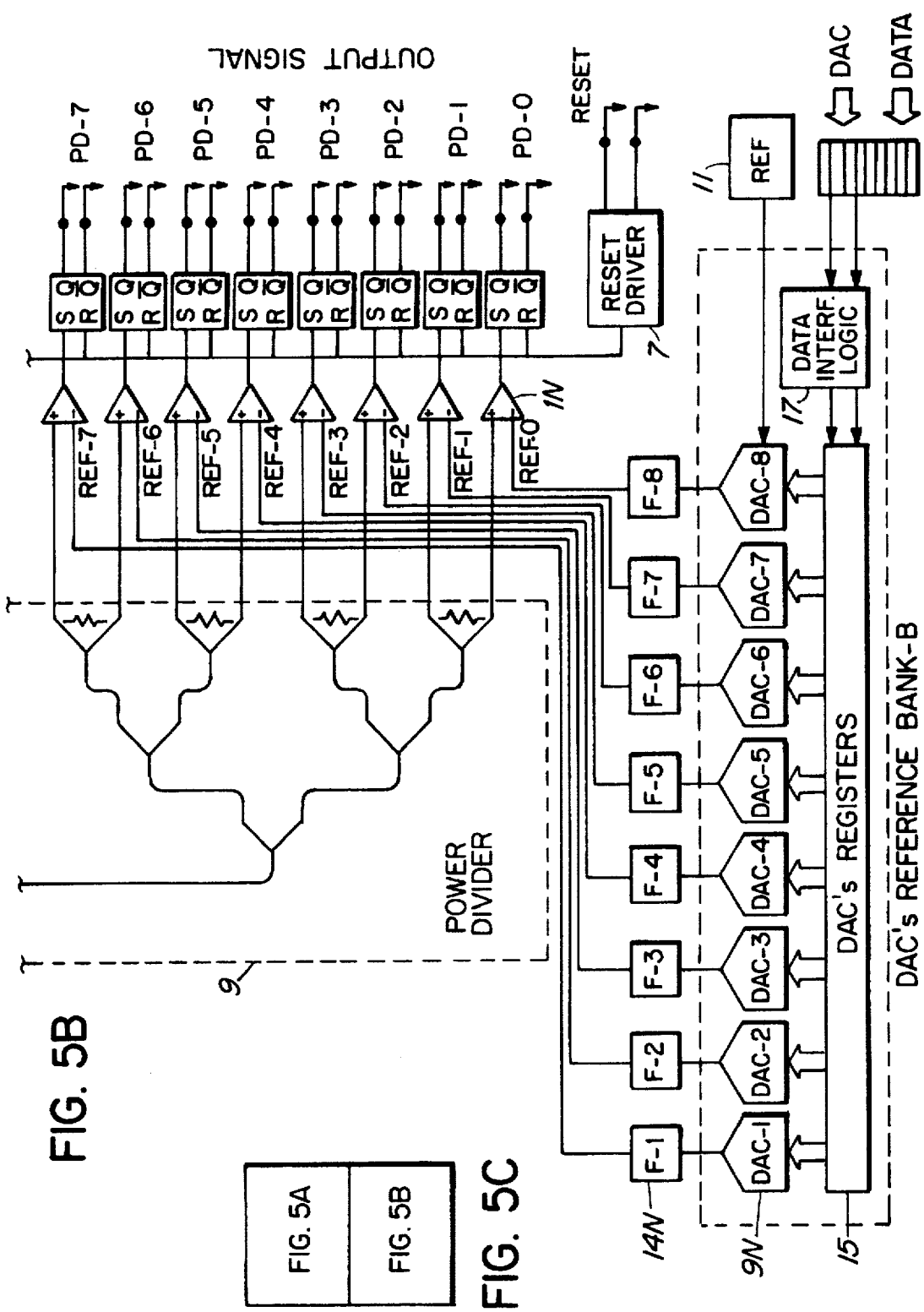

ns* Pt5,717,349

WIDEBAND DIGITAL PEAK DETECTOR

FIELD OF THE INVENTION

This invention relates to the field of digital signal peak detectors.

BACKGROUND TO THE INVENTION

To digitize the peak amplitude of an input signal $V_{IF}$ 100 within a programmable sampled window 102 defined between two consecutive reset pulses 104 of a $V_{RESET}$ signal as shown in FIG. 1, the input signal 100 is typically sampled at a rate consistent with the requirements of the system bandwidth. The higher the frequency of the input signal the higher the peak digitization rate may be. The maximum value of the signal to be sampled during the peak detection window interval is referred to as its peak.

Analog sampling techniques using open loop analog peak detectors 106 such as shown in FIG. 2 have suffered from errors inherent in the characteristics of the components used in the sampling circuits, and if feedback signals are used to correct for these errors as in the peak detector 108 shown in FIG. 3, the speed of the circuit suffers, thus limiting the bandwidth of the signal to be sampled (i.e. the capability of the circuit to sample wider bandwidth signals or signals centered at higher IF frequencies).

Peak detection which provides a digital thermometers code representing the signal peak within the sampling interval has been performed using a circuit similar to that shown in FIG. 4.

A plurality of comparators 1A, 1B, ... 1N have an analog input signal $V_{IF}$ to be "peak detected" (during the window of interest) supplied to each of the noninverting inputs of each comparator. A reference signal $V_{REF}$ is supplied to an input of a signal divider represented in FIG. 4 by a series of resistors 3A, 3B, ... 3(N+1). Each tap of the signal divider is connected to an inverting input of a corresponding comparator. As a result each successive comparator is provided with a decreasing voltage value of the reference signal.

Each comparator compares the input voltage $V_{IF}$ to the reference voltage $V_{REF}$, where $V_{REF}$ is the tapped reference voltage from the signal divider to the corresponding comparator. The output signal of each comparator has either of two states since the open loop gain of comparators is very high.

$$V_{comp} = Av(V_{IF} - V_{REFi}),$$

where Av>>>1

The two states are given by the following expressions:

if $V_{IF} < V_{REFi}$ then comparator i has output voltage $V_{COMPL}$ if $V_{IF} \geq V_{REFi}$ then comparator i has output voltage $V_{COMPH}$.

The output of each comparator is connected to the "set" input S of a corresponding flip flop 5A ... 5N. When the value of the output signal to the flip flop is in excess of its operation threshold value, the flip flop is set. Setting of a flip flop provides an output logic signal at its Q output. The combination of the output logic signals of the flip flops, which appear on conductors $P_1-P_N$ connected to the Q outputs provides a digital thermometer code which represents the peak value of the $V_{IF}$ input signal during the interval $T_{RESET}$ (see FIG. 1). These outputs are provided to a latch 6, which provides a digital peak data signal at its output with the application of the signal $V_{LATCH}$ to it.

To prepare the flip flops for operation, a reset logic signal $V_{RESET}$ is applied to the reset input R of each flip flop together. Each time the reset signal is removed, the flip flops can receive an output signal from the corresponding comparator, and become set or not set, depending on the value of the output signal from the comparator to which it is connected.

An advantage of the above-described design is that it can be used to peak detect input signals that have frequency components up to approximately 50 MHz, while the physical size of the circuit is reasonably small.

However, the above-described design cannot be used to sample input signals of very wide bandwidth, and it cannot be used to sample input signals of higher frequencies. These limitations are imposed by signal propagation delays through the components when the circuit is realized using discrete devices. In addition, the design has performance limitations imposed by the component tolerances.

SUMMARY OF THE INVENTION

The present invention overcomes the bandwidth limitation of the above-described circuit, and can enable wideband digital peak detection at significantly higher IF frequencies and/or wider signal bandwidths than the above-described circuit.

In accordance with the present invention, a reference voltage against which the input signal is compared is digitally adjusted. This enables the circuit to achieve a linear peak detector transform function as compared to the prior art circuit. Indeed, since the reference voltage is digitally tuned, it can be set to any transform function desired, such a logarithmic, (if digital peak power measurement is desired) etc. The use of a digitally adjusted reference voltage eliminates the reference voltage variation for each step in the voltage divider of the prior art caused by variation in resistor tolerances and by propagation effects.

In accordance with another improvement, the input signal is simultaneously distributed to each comparator for comparison against the digitally adjusted reference voltage by a passive power divider, preferably a Wilkinson divider. The advantage is thus achieved that phase and magnitude variations of the input signal from comparator to comparator that were present in the prior art circuit are significantly reduced, thus improving the accuracy of the signal to be peak detected at the comparators. This is very important for high frequency signals where signal excursion time from one peak to the next occurs on sub-nanosecond orders.

In accordance with an embodiment of the invention, a digital peak detector is comprised of a plurality of comparators for outputting signals which, in combination, can form a thermometer code signal, apparatus for distributing an analog input signal to an input of each of the comparators, a plurality of digital to analog converters (DACs), apparatus for providing an output signal of each DAC to another input of a corresponding comparator, and apparatus for applying a digital signal to an input of each DAC to establish a comparison level against which a corresponding DAC can determine an output signal level ($V_{REFi}$).

In accordance with another embodiment, a digital peak detector is comprised of an input port for receiving a wideband input signal, a plurality of comparators, apparatus for providing the same value of the input signal to one input of each of the comparators, a plurality of flip flops equal in number to the plurality of comparators, each having a set input connected to a corresponding output of a comparator, and having outputs carrying signals a group of which constitute a digital thermometer code signal of a digital peak during a set interval of the input signal, apparatus for applying a reset signal at the same time to reset inputs of each of the flip flops, a plurality of digital to analog converters (DACs) equal in number to the comparators, each having an output connected to a second input of a corresponding comparator, apparatus for applying a reference voltage to all of the DACs, and apparatus for applying a particular digital code to a digital input of each of the DACs to provide output analog reference signals ($V_{REFi}$), whereby each comparator provides an output signal (two states) based on a difference between an analog reference signal received at its other input and an input signal received at its first input, setting a corresponding flip flop in the event the difference has sufficiently high logic level.

The states are given by the following relationships:

state: ∅ if $V_{IF} < V_{REFi}$ then the ith comparator output voltage is $V_{COMPOUTL}$ state: 1 if $V_{IF} \geq V_{REFi}$ then the ith comparator output voltage is $V_{COMPOUTH}$

BRIEF INTRODUCTION TO THE DRAWINGS

A better understanding of the invention will be obtained by reading the description of the invention below, with reference to the following drawings, in which.

Figure 5A:
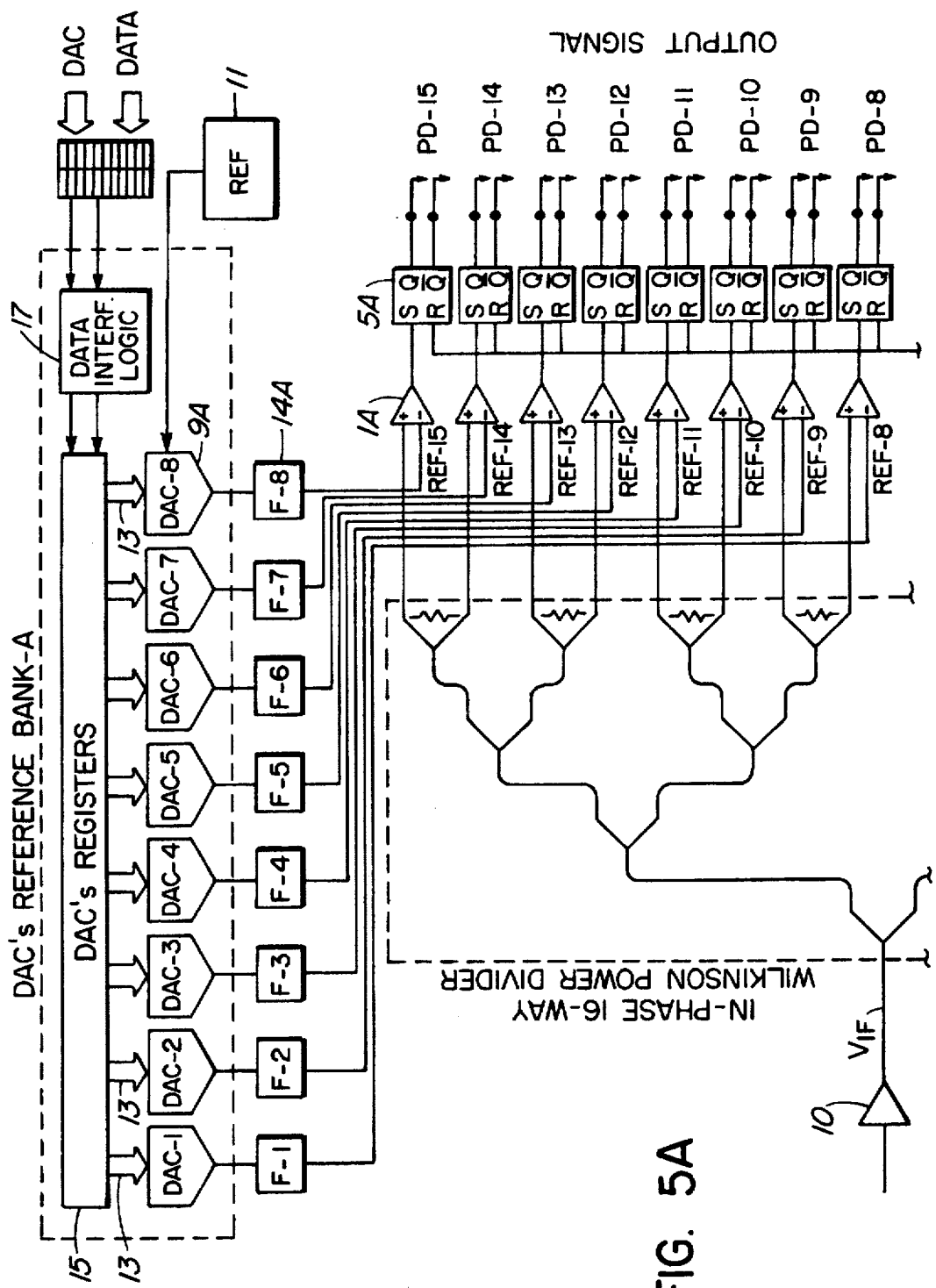

FIGS. 5A and 5B, placed together as shown in FIG. 5C, form a schematic diagram of a wide band digital peak detector according to the preferred embodiment of the present invention.

Figure 6A:
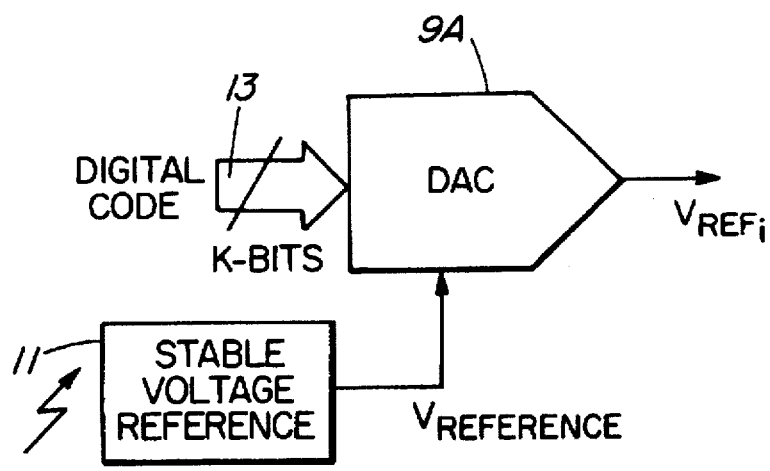
Figure 6B:
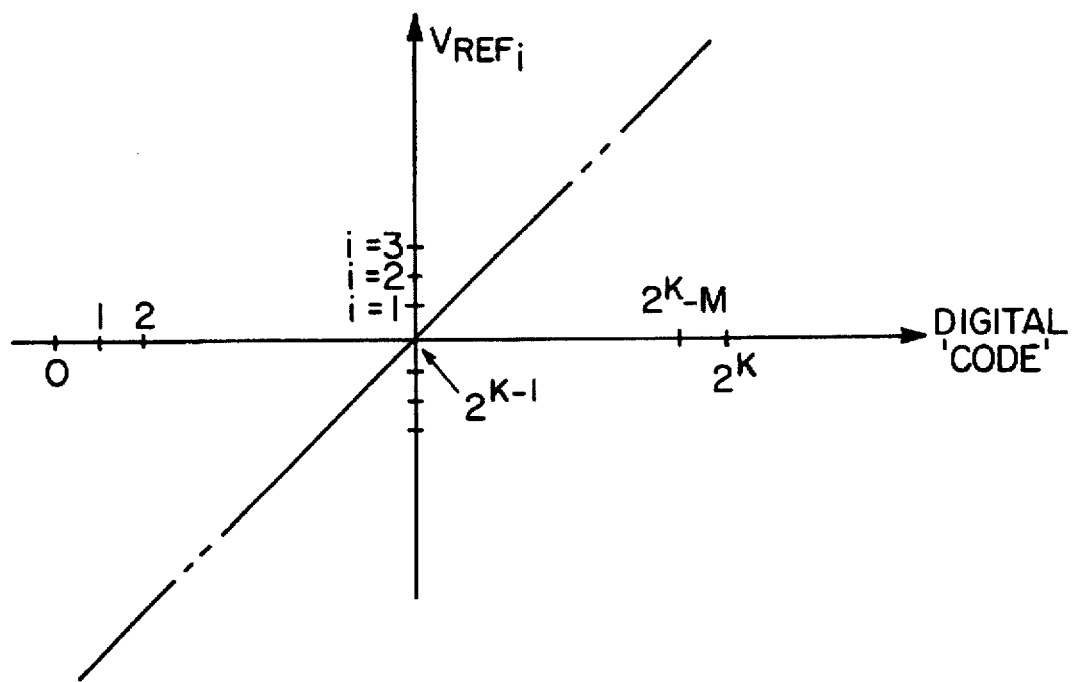
Figure 7:
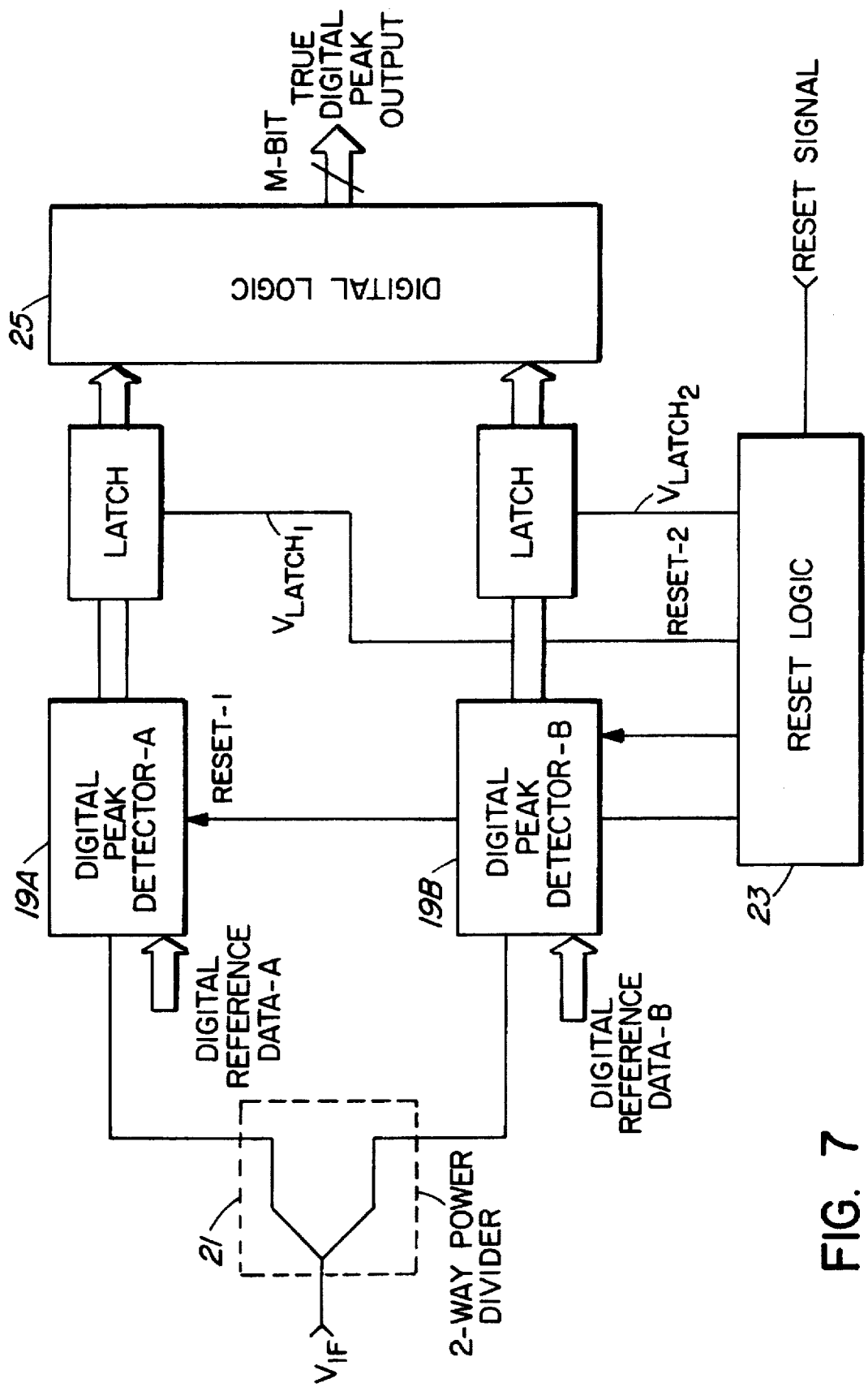

FIG. 6A is a block diagram of a digital to analog converter as used in an embodiment of the present invention, FIG. 6B is a transfer function of the digital to analog converter of FIG. 6A, and FIG. 7 is a wideband digital peak detector subsystem in accordance with another embodiment of the present invention.

DETAILED DESCRIPTION OF THE INVENTION

Figure 1:
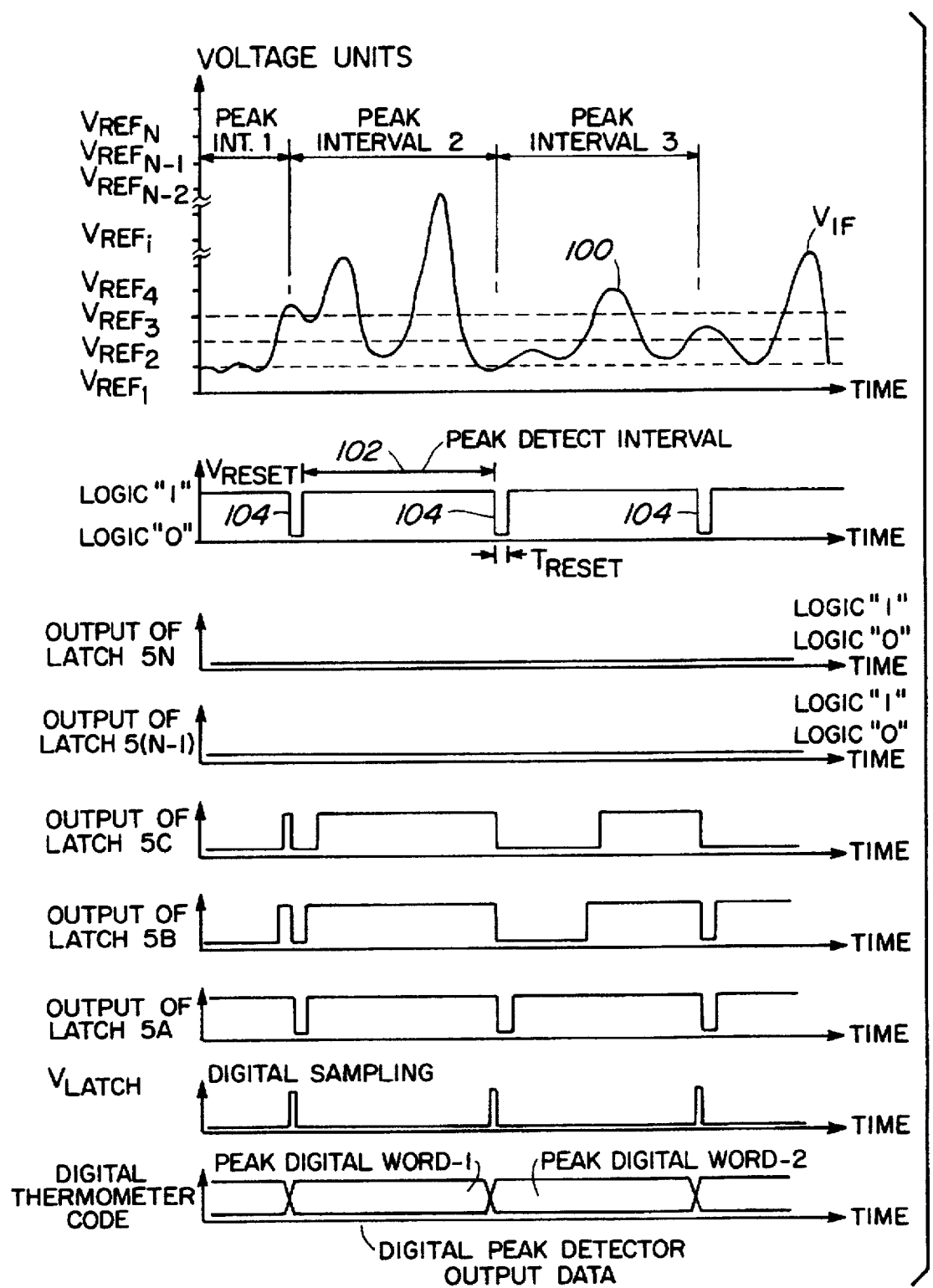
FIG. 1 is a timing diagram used to illustrate operation of the invention.
Figure 2:
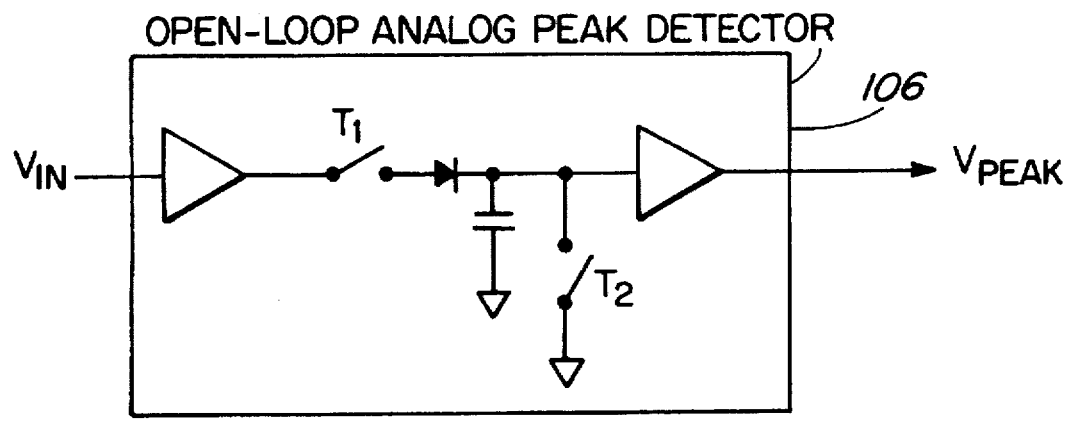
FIGS. 2 and 3 are schematic diagrams of prior art circuits of analog peak detectors.
Figure 3:
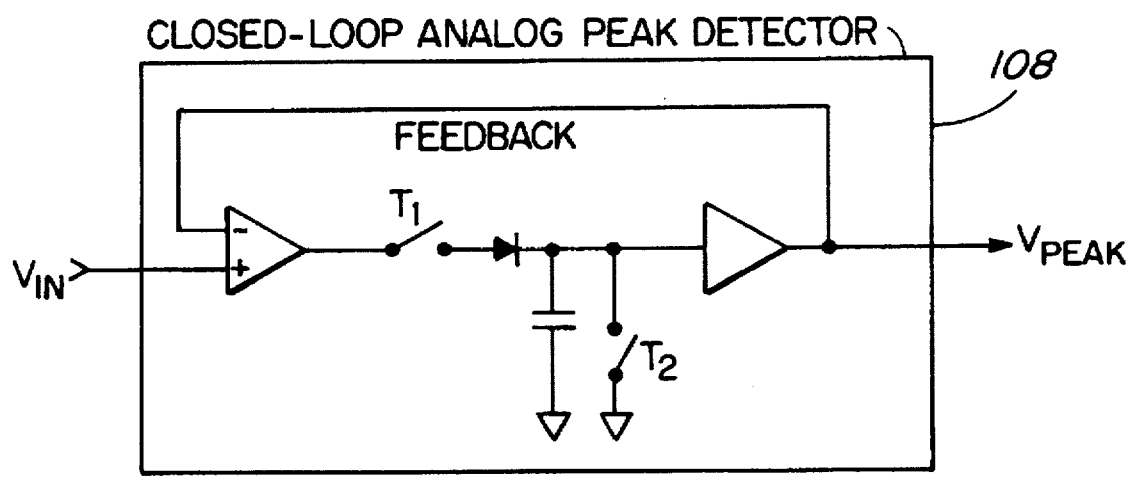
Figure 4:
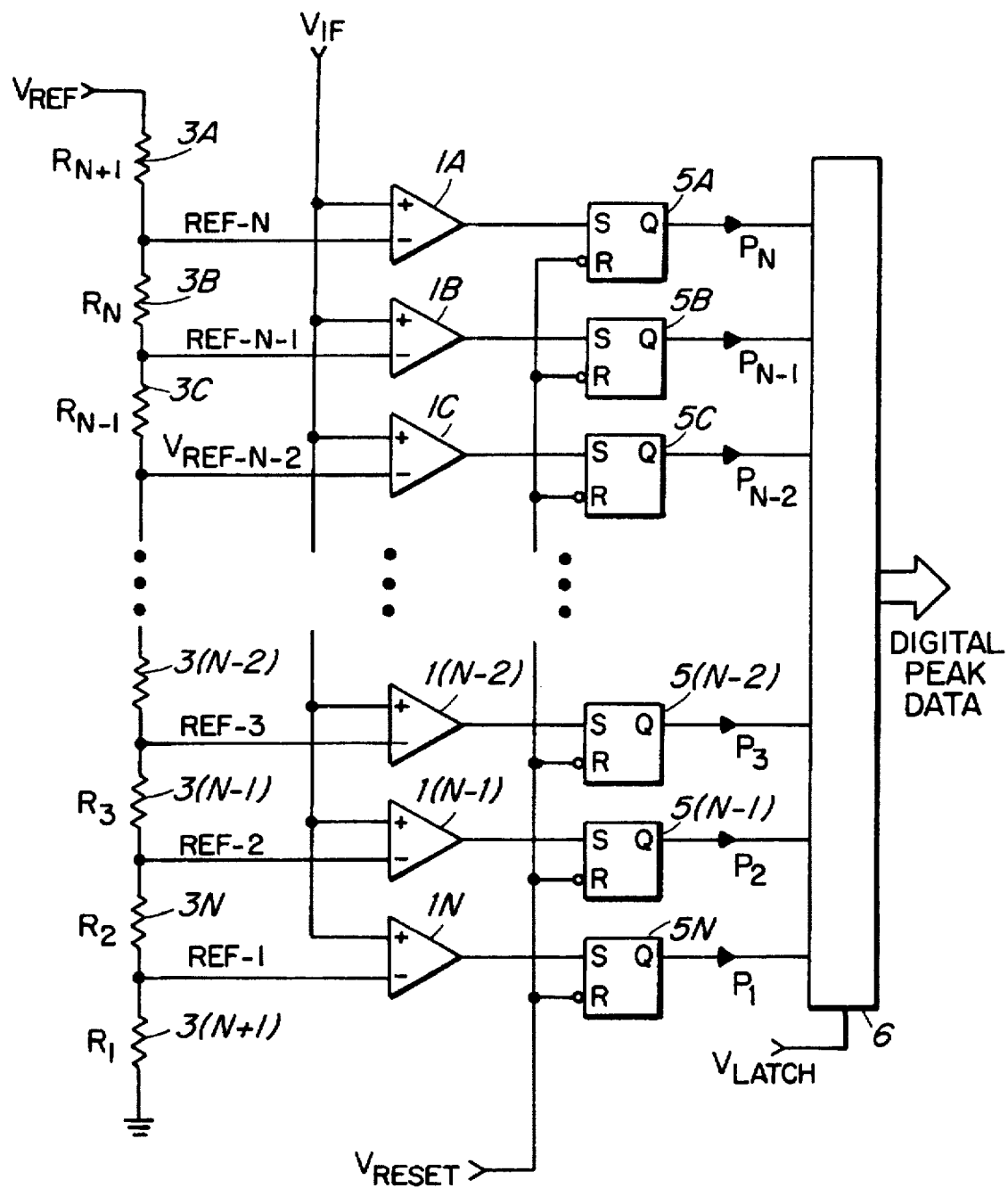
FIG. 4 is a schematic diagram of a digital peak detector in accordance with the prior art.

With reference to FIGS. 1, 5A and 5B, a plurality of comparators 1A–1N are provided, as in the prior art system described with reference to FIG. 1. Each of the comparators has its output connected to the set input S of a corresponding flip-flop 5A–5N. The reset inputs R of the flip-flops are connected together to a reset logic signal source, such as reset driver 7, which receives a reset input control signal from high speed logic, not shown.

However, instead of dividing the input signal to be peak detected down as in the prior art, equal values corresponding to the input signal $V_{IF}$ are provided to the inputs, e.g. the noninverting inputs of each of the comparators 1A–1N. This can be achieved by a passive power divider 9, preferably a Wilkinson power divider, accessing the signal from an amplifier 10. The Wilkinson power divider is a passive device that can equally split an input signal $V_{IN}$ to N output signals. The split is controlled very accurately in terms of magnitude and phase. The Wilkinson power divider can achieve close to theoretical performance at frequencies from 50 MHz up to millimeter wavelengths. Thus fractions of the input signal that are very precisely equal to each other in amplitude and phase are applied to corresponding inputs of each of the comparators.

A plurality of digital to analog converters (DACs) 9A–9N receive digital input signals at their inputs, FIG. 6A illustrating a representative one of the DACs 9A. A stable voltage reference $V_{REFERENCE}$ from a voltage reference source 11 is applied to all of the DACS. A digital code is applied to the input of each DAC via buses 13 which are K bits wide. Each DAC provides an output signal $V_{REFi}$ which is equal to $\pm(CODE/2^{K-1}) V_{REFERENCE}$, where $V_{REFERENCE}$ is the voltage output of the reference voltage source and, K is the number of bits in the code value, and CODE is the particular bits of digital code signal value.

To provide a linear transform, the transfer function of each digital to analog converter should be as shown in FIG. 6B, which is a plot of $V_{REFi}$ against the digital code. If a logarithmic or other transfer function is desired, the plot should be modified accordingly, and the appropriate required digital code will be evident from the plot.

The particular codes that are applied to the respective DACs are stored in registers 15, which have outputs connected to the respective inputs of DACs 9A–9N via buses 13. The codes are received by the registers 15 via an interface 17, which receives data from an external source.

In FIGS. 5A and 5B, the system is shown split into two symmetrical parts, each fed by a separate group of DACs an associated registers. This layout may be desirable, or some other layout may be alternatively be desirable for a particular application.

In operation, data from the external data source defining codes for the various DACs in accordance with the aforenoted function (if the response is to be linear) passes through data interface 17 and is stored in registers 15. This data is received at the input of each DAC. A resulting analog output signal from each DAC is provided to a corresponding input of a comparator 1A–1N through a low pass filter 14A–14N (which limits the noise level which might otherwise cause false peak detection). The codes applied to the respective DACs will be such as to cause a successively increasing analog output signal from successive DACS to be provided to successive comparators. Since the DACs are digitally driven, they can be precisely adjusted to the function desired.

The identical representative precise fraction of the input signal $V_{IF}$ is provided to the other input of each of the comparators 1A–1N. A comparison of the input signals to each comparator results in an output signal representing two states. The flip flops 5A–5N provide an output logic (1) signal, every time the output of the comparator switches from a voltage $V_{COMPL}$ to $V_{COMPH}$ once reset by the reset signal from reset driver 7, in a similar manner as described earlier with respect to the prior art.

However, in the present case the digital adjusting of the reference signal presented to the comparators are very stable and accurate, and are devoid of tolerance and phase shift problems inherent in the prior art system. Further, in case such problems have been found to exist due to layout or other limitations or problems, the codes applied to the DACs can be changed to reduce the problem by counteracting the inherent variation in the accuracy of the system. Furthermore the distribution of the wide band and/or high frequency input signal $V_{IF}$ can be periodically applied to the input of each comparator using a passive Wilkinson power divider thus eliminating problems of propagations delays encountered in previous circuits.

FIG. 7 illustrates another embodiment of the invention. In this case two digital peak detectors 19A and 19B are provided the same input signal $V_{IF}$, split in a two way power divider 21. The outputs of the two digital peak detectors are combined in digital logic 25. Reset logic 23, driven by a reset signal, applies a reset signal to the groups of flip flops in each digital peak detector 19A and 19B staggered in time.

Since during the reset interval of a single digital peak detector there is ambiguity as to the value of the peak, staggering the reset signals of two digital peak detectors causes generation of a peak value from the flip flops of each digital peak detector during the reset interval of the other, in sequence. The digital logic 25 can decide on the true peak following each respective output, and provide a true digital peak output value signal on an output bus 27.

A person understanding this invention may now conceive of alternative structures and embodiments or variations of the above. All of those which fall within the scope of the claims appended hereto are considered to be part of the present invention.

We claim:

1. A digital peak detector comprising:
   (a) an input port for receiving one or both of a wideband and a high IF frequency input signal,
   (b) a plurality of high speed comparators,
   (c) means for providing the same value of the input signal to a first input of each of the comparators using a Wilkinson power divider,
   (d) a plurality of flip flops equal in number to the plurality of comparators, each having a set input connected to a corresponding output of a comparator, and having outputs carrying signals a group of which constitutes a digital thermometer code signal of the peak detected during an interval of the input signal,
   (e) means for applying a reset signal at the same time to reset inputs of each of the flip flops,
   (f) a plurality of digital to analog converters (DACs) equal in number to the comparators, each having an output connected in series with a filter to a second input of a corresponding comparator,
   (g) means for applying a reference voltage to all of the DACs, and
   (h) means for applying a particular digital code to a digital input of each of the DACs to provide output analog reference signals $V_{REFi}$,
   whereby each comparator provides an output signal consisting of two states based on an amplified difference between an analog reference signal received at its second input and an input signal received at its first input, setting a corresponding flip flop in the event the difference has sufficiently high logic level.

2. A digital peak detector as defined in claim 1 in which each particular digital code is provided to cause an analog reference voltage $V_{REFi}$ to be $=\pm(CODE/2^{K-1})V_{REF}$ where CODE is particular signal code value, K is the number of bits in the digital code and $V_{REF}$ is the reference voltage.

3. A digital peak detector as defined in claim 2 in which said digital codes are established such that no $V_{REFi}$ from any DAC is equal to any other and that a digital word formed of logical outputs from the flip flops provides a value with increasing input signal values having a predetermined transfer function.

4. A digital peak detection as defined in claim 3 in which the transfer function is linear.

5. A digital peak detector as defined in claim 3 including registers for storing said codes, connected to inputs of the DACs, and means for applying a control signal to the registers for establishing said codes.

6. A digital peak detector comprising:
   (a) a plurality of comparators for outputting signals which, in combination, can form a thermometer code signal,
   (b) means for distributing an analog input signal to an input of each of the comparators,
   (c) a plurality of digital to analog converters (DACs),
   (d) means for providing an output signal of each DAC to another input of a corresponding comparator, and
   (e) means for applying a digital signal to an input of each DAC to establish a comparison level $V_{REFi}$ against which a corresponding DAC can determine an output signal level.

7. A digital peak detector as defined in claim 6 in which each input of said comparator receives a similar value of the distributed analog input signal.

8. A digital peak detector as defined in claim 7 further including a plurality of flip flops, each having an input connected to an output of a corresponding comparator, whereby each flip flop can be set in the event the output signal level of said corresponding comparator is above an operation threshold level for that flip flop.

9. A digital peak detector as defined in claim 8 further including means for applying a reset signal to all of the flip flops together.

10. A digital peak detector as defined in claim 8 in which the digital signal applied to an input of each DAC is established to cause said comparison level $V_{REFi}$ to be equal to $\pm(CODE/2^{K-1})V_{REFERENCE}$ where CODE is the particular signal code value, K is the number of bits in the code value and $V_{REFERENCE}$ is the reference voltage applied to each DAC.

11. A digital peak detector as defined in claim 10 in which the distributed analog input signal is provided with the same value and the same time relationship to each of the comparators.

12. A digital peak detector as defined in claim 11 in which said comparison levels are established such that no $V_{REF}$ from any DAC is equal to any other, and that a digital word formed of logical outputs from the flip flops provides a linearly increasing value with increasing input signal values.

13. A digital peak detector as defined in claim 12 in which said means for providing said input signal is a power divider.

14. A pair of digital peak detectors, each comprising:
   (a) a plurality of comparators for outputting signals which, in combination, can form a thermometer code signal,
   (b) means for distributing an analog input signal to an input of each of the comparators,
   (c) a plurality of digital to analog converters (DACs),
   (d) means for providing an output signal of each DAC to another input of a corresponding comparator,
   (e) means for applying a digital signal to an input of each DAC to establish a comparison level $V_{REFi}$ against which a corresponding DAC can determine an output signal level,
   (f) each input of said comparator receiving a similar value of the distributed analog input signal,
   (g) a plurality of flip flops, each having an input connected to an output of a corresponding one of said comparators, whereby each flip flop can be set in the event the output signal level of said corresponding comparator is above an operation threshold level for that flip flop,
   (h) means for applying a reset signal to all of the flip flops together, and
   (i) means for applying the same value input signal to each distributing means, and means for applying said rest signal at staggered times to all of the flip flops of the respective digital peak detectors.

* * * * *